United States Patent
Omura et al.

(10) Patent No.: US 9,857,035 B2
(45) Date of Patent: Jan. 2, 2018

(54) LIGHT EMITTING DEVICE, LIGHT SOURCE FOR ILLUMINATION, AND ILLUMINATION APPARATUS

(71) Applicant: PANASONIC INTELLECTUAL PROPERTY MANAGEMENT CO., LTD., Osaka (JP)

(72) Inventors: Koji Omura, Osaka (JP); Toshiaki Kurachi, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 189 days.

(21) Appl. No.: 14/596,548

(22) Filed: Jan. 14, 2015

(65) Prior Publication Data

US 2015/0204493 A1 Jul. 23, 2015

(30) Foreign Application Priority Data

Jan. 20, 2014 (JP) .................... 2014-008106

(51) Int. Cl.
*F21K 99/00* (2016.01)
*F21S 8/02* (2006.01)
(Continued)

(52) U.S. Cl.
CPC ............. *F21K 9/56* (2013.01); *F21K 9/232* (2016.08); *F21S 8/026* (2013.01); *H01L 25/00* (2013.01);
(Continued)

(58) Field of Classification Search
CPC ......... H01L 25/042; F21K 9/56; F21K 9/232; F21S 8/026
See application file for complete search history.

(56) References Cited

U.S. PATENT DOCUMENTS

2002/0070681 A1* 6/2002 Shimizu .............. H01L 25/0753
315/246
2006/0226759 A1* 10/2006 Masuda ............. C09K 11/0883
313/486
(Continued)

FOREIGN PATENT DOCUMENTS

DE 102005059362 9/2006
DE 102008011061 8/2008
(Continued)

OTHER PUBLICATIONS

Zollers, Michael, "Phosphor Modeling in LightTools: Ensuring Accurate White LED Models", White Paper, Jan. 2011, pp. 1-3.

*Primary Examiner* — Robert May
*Assistant Examiner* — Leah S Macchiarolo
(74) *Attorney, Agent, or Firm* — Greenblum & Bernstein, P.L.C.

(57) ABSTRACT

A light emitting device that emits white light includes first and second light emitting elements which have different emission peak wavelengths within a range of 440 nm to 495 nm. The device also includes a wavelength conversion material which converts a wavelength of light emitted by at least one of the first and second light emitting elements. The white light has an emission spectrum peaked at a first peak wavelength and a second peak wavelength. The first peak wavelength corresponds to the emission peak wavelength of the first light emitting element, and the second peak wavelength corresponds to the emission peak wavelength of the second light emitting element. Where a light intensity at one of the first peak wavelength and the second peak wavelength is 1, a light intensity at a bottom of a valley between the first and second peak wavelengths is 0.5 or higher but lower than 1.0.

15 Claims, 20 Drawing Sheets

(51) Int. Cl.
   *H01L 25/00*  (2006.01)
   *F21K 9/232*  (2016.01)
   *F21Y 105/10*  (2016.01)
   *F21Y 115/10*  (2016.01)
   *F21Y 113/13*  (2016.01)

(52) U.S. Cl.
   CPC ....... *F21Y 2105/10* (2016.08); *F21Y 2113/13* (2016.08); *F21Y 2115/10* (2016.08); *H01L 2224/45144* (2013.01); *H01L 2224/48137* (2013.01); *H01L 2924/181* (2013.01)

(56) References Cited

U.S. PATENT DOCUMENTS

| | | |
|---|---|---|
| 2007/0223219 A1 | 9/2007 | Medendorp, Jr. et al. |
| 2008/0203900 A1 | 8/2008 | Chen et al. |
| 2010/0118510 A1 | 5/2010 | Bailey et al. |
| 2011/0222277 A1 | 9/2011 | Negley et al. |
| 2011/0248295 A1 | 10/2011 | Stauss et al. |
| 2013/0242532 A1 | 9/2013 | Nishimura et al. |
| 2014/0319560 A1* | 10/2014 | Tischler .......... H01L 29/00 257/98 |

FOREIGN PATENT DOCUMENTS

| | | |
|---|---|---|
| DE | 102008021572 | 12/2008 |
| DE | 102008050643 | 4/2010 |
| DE | 102010046300 | 4/2012 |
| JP | 2004-80046 | 3/2004 |
| JP | 2005-005482 A | 1/2005 |
| JP | 2006-313717 | 11/2006 |
| JP | 2007-134606 | 5/2007 |
| JP | 2009-43447 | 2/2009 |
| JP | 2009-266974 | 11/2009 |
| JP | 2010-182724 A | 8/2010 |
| JP | 2011-210621 | 10/2011 |
| JP | 2012-505527 | 3/2012 |
| JP | 2012-191225 | 10/2012 |
| JP | 2013-191385 A | 9/2013 |
| WO | 2010-040327 | 4/2010 |

* cited by examiner

FIG. 2B

| Ra | R1 | R2 | R3 | R4 | R5 | R6 | R7 | R8 |
|---|---|---|---|---|---|---|---|---|
| 93.9 | 90.7 | 96.6 | 90.4 | 91.8 | 93.4 | 92.4 | 99.2 | 96.5 |

| R9 | R10 | R11 | R12 | R13 | R14 | R15 |
|---|---|---|---|---|---|---|
| 95.7 | 98.6 | 91.5 | 95.0 | 92.0 | 91.3 | 92.7 |

FIG. 3B

| Ra | R1 | R2 | R3 | R4 | R5 | R6 | R7 | R8 |
|---|---|---|---|---|---|---|---|---|
| 94.4 | 91.6 | 96.0 | 93.1 | 94.2 | 94.2 | 92.5 | 97.9 | 95.9 |

| R9 | R10 | R11 | R12 | R13 | R14 | R15 |
|---|---|---|---|---|---|---|
| 94.3 | 99.4 | 95.5 | 93.0 | 92.7 | 93.2 | 92.3 |

FIG. 4B

| Ra | R1 | R2 | R3 | R4 | R5 | R6 | R7 | R8 |
|---|---|---|---|---|---|---|---|---|
| 95.0 | 93.8 | 94.1 | 98.3 | 95.3 | 94.9 | 92.0 | 95.3 | 96.0 |

| R9 | R10 | R11 | R12 | R13 | R14 | R15 |
|---|---|---|---|---|---|---|
| 90.5 | 91.8 | 96.1 | 90.0 | 93.8 | 98.8 | 92.6 |

FIG. 5B

| Ra | R1 | R2 | R3 | R4 | R5 | R6 | R7 | R8 |
|---|---|---|---|---|---|---|---|---|
| 93.7 | 91.1 | 97.3 | 90.8 | 90.5 | 93.1 | 93.5 | 98.2 | 95.0 |

| R9 | R10 | R11 | R12 | R13 | R14 | R15 |
|---|---|---|---|---|---|---|
| 94.4 | 98.8 | 90.0 | 91.4 | 92.8 | 92.1 | 92.6 |

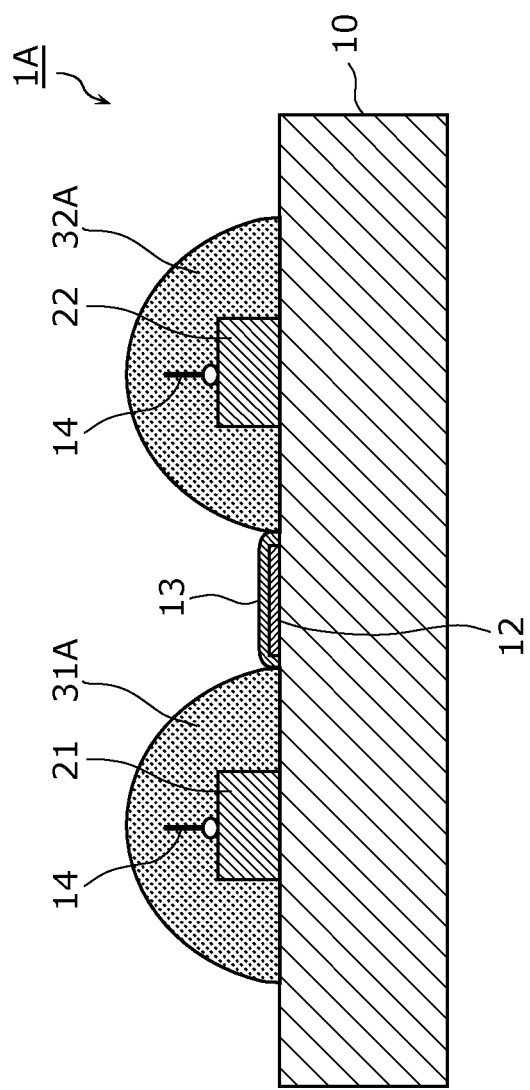

US 9,857,035 B2

LIGHT EMITTING DEVICE, LIGHT SOURCE FOR ILLUMINATION, AND ILLUMINATION APPARATUS

BACKGROUND OF THE INVENTION

1. Field of the Invention

The present disclosure relates to a light emitting device, a light source for illumination, and an illumination apparatus.

2. Description of the Related Art

Semiconductor light emitting elements such as light emitting diodes (LEDs) have a small size, a high efficiency, and a long life and thus have been considered as a future light source of various products for illumination and display, etc.

For example, for illumination, LEDs (LED chips) have been served as light sources of LED lamps. Such an LED lamp can be a bulb-shaped LED lamp (an LED bulb) as a substitute for a bulb-shaped fluorescent lamp or an incandescent lamp, or a straight tube LED lamp as a substitute for a straight tube fluorescent lamp. For example, Japanese Unexamined Patent Application Publication No. 2006-313717 discloses a conventional bulb-shaped LED lamp, and Japanese Unexamined Patent Application Publication No. 2009-043447 discloses a conventional straight tube LED lamp.

Also, the LEDs are used in an LED luminaire or the like as a substitute for a downlight, a spotlight, or the like used in a store or the like. For example, Japanese Unexamined Patent Application Publication No. 2011-210621 discloses an in-ceiling LED luminaire (downlight) that is embedded in a ceiling and emits light downward.

In the LED lamp and the LED luminaire, the LEDs are incorporated into a unit as an LED module (light emitting device) that emits light of a predetermined color such as white light. The LED lamp and the LED luminaire use, for example, a (blue-yellow-based) LED module having blue LED chips that emit blue light and yellow phosphors that are excited by the blue light to emit yellow light.

SUMMARY OF THE INVENTION

The light emitting device according to each of various embodiments of the present disclosure emits white light. The light emitting device includes a first light emitting element and a second light emitting element which have different light emitting peak wavelengths within a range of 400 nm to 495 nm. The light emitting device also includes a wavelength conversion material that converts a wavelength of light emitted by at least one of the first light emitting element and the second light emitting element. The white light, which is generated from lights emitted by the first light emitting element and the second light emitting element, has an emission spectrum peaked at a first peak wavelength and a second peak wavelength. The first peak wavelength corresponds to an emission peak wavelength of the first light emitting element, and the second peak wavelength corresponds to an emission peak wavelength of the second light emitting element. Where a light intensity at one of the first peak wavelength and the second peak wavelength is 1, a light intensity at a bottom of a valley between the first peak wavelength and the second peak wavelength is 0.5 or higher but lower than 1.0.

BRIEF DESCRIPTION OF DRAWINGS

FIG. 2B shows color rendering indexes of the light emitting device having the emission spectrum shown in FIG. 2A;

FIG. 3B shows color rendering indexes of the light emitting device having the emission spectrum shown in FIG. 3A;

FIG. 4B shows color rendering indexes of the light emitting device having the emission spectrum shown in FIG. 4A;

FIG. 5B shows color rendering indexes of the light emitting device having the emission spectrum shown in FIG. 5A;

FIG. 6B is a sectional view of the light emitting device according to the variation of the first embodiment, taken along line 6B-6B in FIG. 6A;

DETAILED DESCRIPTION OF THE PREFERRED EMBODIMENTS

Prior to the embodiments disclosed herein, problems in the light emitting devices of the related arts will be described.

One of the properties required in illumination light is high color rendering. The color rendering indicates faithfulness of color appearance of an objet illuminated by illumination light. In order to evaluate color rendering of illumination light, indications called color rendering indexes (average color rendering indexes and special color rendering indexes) are used. The highest value of each color rendering index is 100. Illumination light having higher values of color rendering indexes is more faithful in color appearance. In general, a color rendering index for high color rendering has a value of 90 or greater.

However, conventional blue-yellow-based LED modules have considerable difficulties in having all the color rendering indexes indicate a value of 90 or greater.

Therefore, in order to improve color rendering of illumination light, the inventors of the present disclosure have first focused on the special color rendering indexes. Among the color rendering indexes, there is special color rendering index R12 that indicates faithfulness of bright blue color appearance. The inventors of the present disclosure have focused on, in particular, special color rendering index R12.

Figure 12:
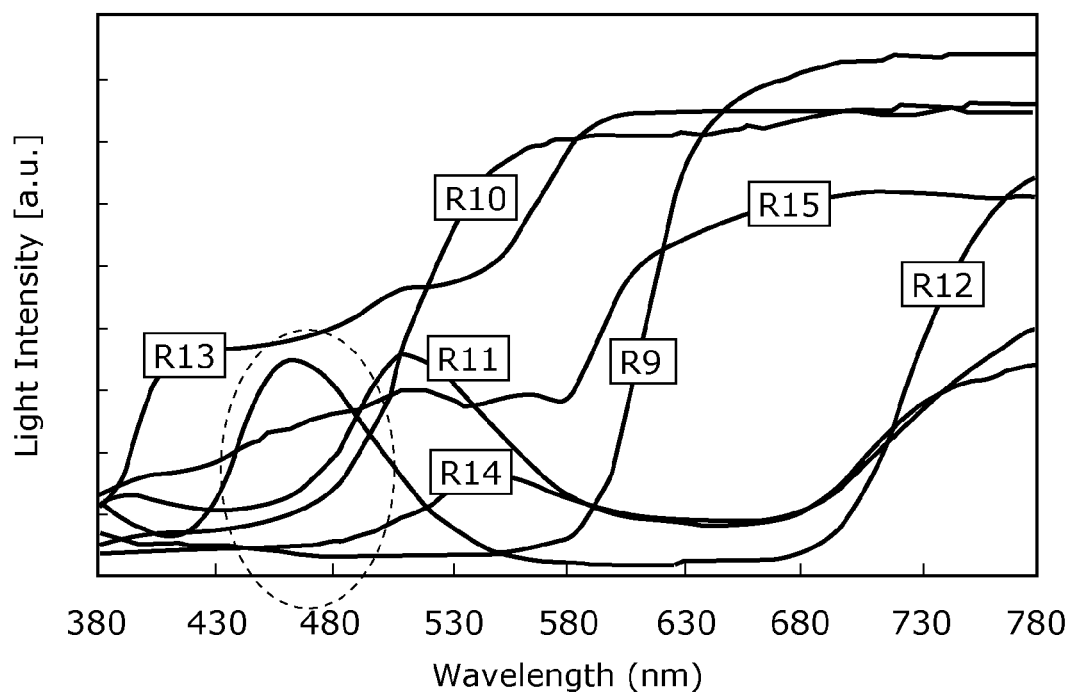
FIG. 12 is a graph plotting spectral reflectivity spectra of special color rendering indexes (R9 to R15).

FIG. 12 shows spectral reflectivity spectra of special color rendering indexes (R9 to R15). R9 to R15 indicate faithfulness of color appearance of red (R9), yellow (R10), green (R11), blue (R12), skin color of Caucasoid (R13), color of foliage (R14), and skin color of Japanese people (R15), respectively.

As seen in FIG. 12, special color rendering index R12 is increased if color components (wavelength components) are supplemented to a part surrounded by a broken line in FIG. 12.

The present disclosure have been conceived under the above-described observations. It has been found that all the color rendering indexes including special color rendering index R12 have a value of 90 or greater, if color components are supplemented to the part surrounded by the broken line in FIG. 12 in order to set a difference between a peak and a bottom of a valley to be within a certain range to cause a part between two peak wavelengths (peak-to-peak) to be within a predetermined range.

The following is a description of embodiments of the present disclosure with reference to the accompanying drawings. Any of the embodiments described below will illustrate one specific preferable example of the present disclosure. Thus, the numerical values, shapes, materials, structural components, the arrangement and connection of the structural components, steps and the order of the steps mentioned in the following embodiments are merely an example and not intended to limit the present disclosure.

Incidentally, each of the figures is a schematic diagram and not necessarily illustrated in a strict manner. Furthermore, in each of the figures, substantially the same structures are assigned with the same reference signs, and the redundant description of such structures will be omitted or simplified in some cases.

First Embodiment

Figure 1A:
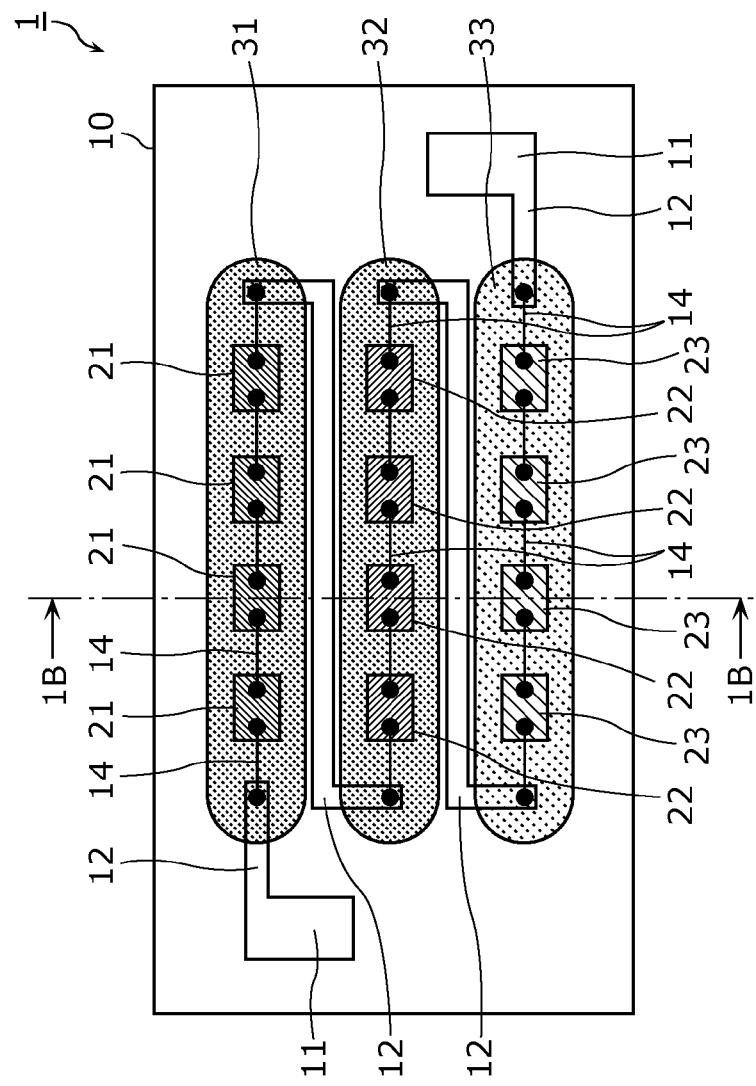
FIG. 1A is a plan view of a light emitting device according to a first embodiment.
Figure 1B:
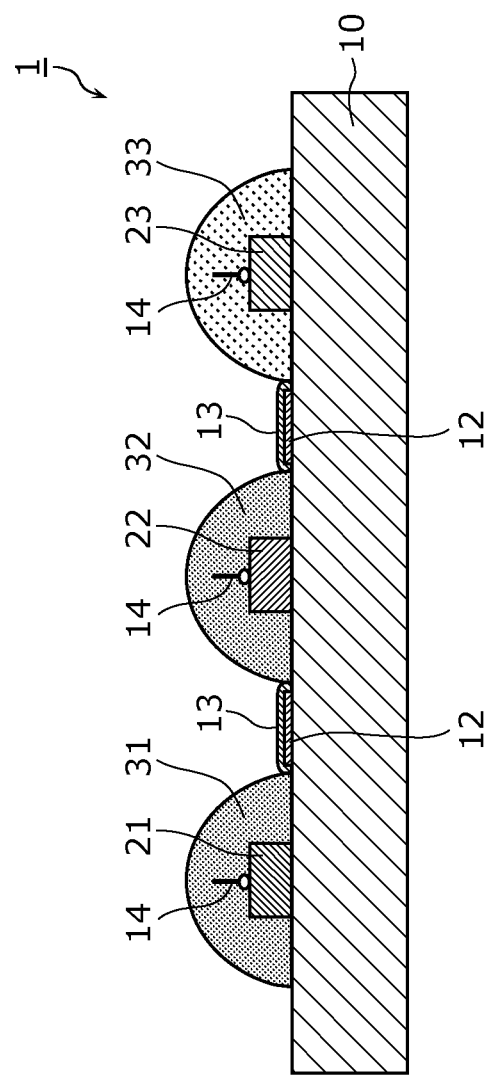
FIG. 1B is a sectional view of the light emitting device according to the first embodiment, taken along line 1B-1B in FIG. 1A.

First, the structure of light emitting device 1 according to a first embodiment will be described with reference to FIGS. 1A and 1B. FIG. 1A is a plan view of light emitting device 1 according to the first embodiment, and FIG. 1B is a sectional view of light emitting device 1 taken along line 1B-1B in FIG. 1A.

Light emitting device 1 is a light emitting module that emits white light. As illustrated in FIGS. 1A and 1B, light emitting device 1 includes substrate 10, first light emitting elements 21, second light emitting elements 22, first sealing member 31, and second sealing member 32. Light emitting device 1 further includes third light emitting elements 23 and third sealing member 33.

The set of first light emitting elements 21, the set of second light emitting elements 22, and the set of third light emitting elements 23 emit lights having respective different peak wavelengths and different color temperatures. First light emitting elements 21 and second light emitting elements 22 emit blue light, while third light emitting elements 23 emit red light.

Furthermore, at least one of first sealing member 31 sealing first light emitting elements 21 and second sealing member 32 sealing second light emitting elements 22 include a wavelength conversion material that converts a wavelength of light emitted by a corresponding one of the set of first light emitting elements 21 and the set of second light emitting elements 22.

According to the present embodiment, first light emitting elements 21, second light emitting elements 22, third light emitting elements 23 are LED chips. Light emitting device 1 is an LED module having a chip-on-board (COB) structure in which these LED chips are mounted directly on substrate 10. The following describes each of the structural components in light emitting device 1 in more detail.

[Substrate]

Substrate 10 is a plate-shaped mounting substrate having a first principal surface (top surface) and a second principal surface (rear surface) opposite to the first principal surface. Substrate 10 can be a ceramic substrate, a resin substrate, a metal base substrate, a glass substrate or the like.

The ceramic substrate can be an alumina substrate, an aluminum nitride substrate or the like. The resin substrate can be, for example, a glass epoxy substrate formed of glass fiber and epoxy resin, a flexible substrate formed of a material such as polyimide, or the like. The metal base substrate can be, for example, an aluminum alloy substrate, an iron alloy substrate, a copper alloy substrate or the like whose surface is provided with an insulating film.

According to the present embodiment, a white ceramic substrate is used as substrate 10. More specifically, a polycrystalline alumina substrate (polycrystalline ceramic substrate) that is formed by sintered alumina particles and has a thickness of about 1 mm, for example, is used as substrate 10.

Although substrate 10 is a rectangle in the planar view, the shape of substrate 10 is not limited to a rectangle. For example, the shape of substrate 10 may be a circle, an ellipse, a polygon such as a triangle or a pentagon, or any other shapes.

On the first principal surface of substrate 10, a pair of feed terminals 11 are provided. The pair of feed terminals 11 are external connecting terminals (electrode terminals) for receiving DC power from the outside (external power source) of light emitting device 1 or the like to cause first light emitting elements 21, second light emitting elements 22, and third light emitting elements 23 to emit light. One of feed terminals 11 in the pair is a connecting terminal at a higher voltage (plus terminal), while the other one of feed terminals 11 is a connecting terminal at a lower voltage (minus terminal).

Each of feed terminals 11 can be, for example, a metal electrode (metal terminal) comprising gold (Au) or the like patterned in the shape of a rectangle. It should be noted that feed terminals 11 may be socket terminals. In this case, each of feed terminals 11 is constituted by a resin socket and an electrically-conductive pin (an electrically-conductive part) for receiving DC power. The electrically-conductive pin is electrically connected to metal wire 12 formed on substrate 10.

Metal wires 12 are power feed lines for supplying first light emitting elements 21, second light emitting elements 22, and third light emitting elements 23 with electric power to cause them to emit light. Each of metal wires 12 comprises a metal material, such as gold (Au), silver (Ag), or cupper (Cu).

Each of metal wires 12 is a wiring pattern having a predetermined shape on the first principal surface of substrate 10. More specifically, metal wires 12 are patterned to extend from each of feed terminals 11 and connect first light emitting elements 21, second light emitting elements 22, and third light emitting elements 23 to have a predetermined connection relationship (serial connection in FIG. 1A).

As illustrated in FIG. 1B, each of metal wires 12 is covered with insulating film 13. Insulating film 13 is, for example, a glass film (glass coating film), an insulating resin coating film (resin coating film), or the like. The insulating resin coating film may be a white resist film having a high reflectivity of about 98%. If substrate 10 is a white substrate, each of insulating films 13 is a transparent film, such as a glass film. Covering of metal wire 12 with insulating film 13 can improve insulation properties (dielectric strength voltage) of substrate 10 and suppress metal oxidation of metal wire 12. It should be noted that insulating film 13 is not provided to a part of metal wire 12 which is connected to wire 14, so that metal of metal wire 12 is exposed at the part as a wire connecting portion.

Each of wires 14 is an electrically-conductive wiring material for wire bonding of individual first light emitting elements 21, second light emitting elements 22, and third light emitting elements 23, and is, for example, a gold wire. More specifically, wires 14 connect first light emitting elements 21, second light emitting elements 22, and third light emitting elements 23 in the chip-to-chip manner. Furthermore, wire 14 connects first light emitting element 21, second light emitting element 22, or third light emitting element 23 to each corresponding metal wire 12.

It should be noted that each of wires 14 may be embedded in first sealing member 31, second sealing member 32, or third sealing member 33 so as not to be exposed from the sealing member.

[Light Emitting Element]

The set of first light emitting elements 21 and the set of second light emitting elements 22 have different emission peak wavelengths within a range of 400 nm to 495 nm which is a blue light emission range. More specifically, each of first light emitting elements 21 emits light having an emission peak wavelength (first peak wavelength) within the range of 440 nm to 495 nm. Each of second light emitting elements 22 emits light having an emission peak wavelength (second peak wavelength) within the range of 440 nm to 495 nm. However, the emission peak wavelength of first light emitting elements 21 is different from the emission peak wavelength of second light emitting elements 22.

First light emitting elements 21 and second light emitting elements 22 are, for example, semiconductor light emitting elements each of which emits light of a predetermined color by predetermined electric power, and is a bare chip emitting visible light of a single color. More specifically, first light emitting elements 21 and second light emitting elements 22 are gallium-nitride (GaN) LED chips that emit blue light when energized.

According to the present embodiment, each of first light emitting elements 21 emits light having a wavelength shorter than a wavelength of light emitted by each of second light emitting elements 22. As an example, each of first light emitting elements 21 emits blue light having an emission peak wavelength of 445 nm.

On the other hand, each of second light emitting elements 22 emits light having a wavelength longer than the wavelength of the light emitted by each of first light emitting elements 21. As an example, second light emitting elements 22 emit blue-green light having an emission peak wavelength of 485 nm.

As described above, according to the present embodiment, the emission peak wavelength (the second peak wavelength) of second light emitting elements 22 is longer than the emission peak wavelength (the first peak wavelength) of first light emitting elements 21. Furthermore, the set of first light emitting elements 21 and the set of second light emitting elements 22 are electrically connected in series to each other.

Each of third light emitting elements 23 emits light having an emission peak wavelength (third peak wavelength) within a range of 620 nm to 750 nm which is a red light emission range. The emission peak wavelength of third light emitting elements 23 is longer than any emission peak wavelength of first light emitting elements 21 and second light emitting elements 22.

Third light emitting elements 23 are, for example, semiconductor light emitting elements each of which emits light of a predetermined color by predetermined electric power, and, according to the present embodiment, is a bare chip emitting visible light of a single color. As an example, third light emitting elements 23 are aluminum-gallium-indium-phosphide (AlGaInP) LED chips that emit red light when energized. As an example, third light emitting elements 23 emit red light having an emission peak wavelength of 630 nm.

Furthermore, the set of third light emitting elements 23 is electrically connected in series to at least one of the set of first light emitting elements 21 and the set of second light emitting elements 22. According to the present embodiment, the set of first light emitting elements 21, the set of second light emitting elements 22, and the set of third light emitting elements 23 are all connected in series.

According to the present embodiment, the set of first light emitting elements 21, the set of second light emitting elements 22, and the set of third light emitting elements 23 are provided on the first principal surface of substrate 10. More specifically, as illustrated in FIG. 1A, four first light emitting elements 21 are connected in series in a line, four second light emitting elements 22 are connected in series in a line, and four third light emitting elements 23 are connected in series in a line.

It should be noted that each of the number of first light emitting elements 21, the number of second light emitting elements 22, and the number of third light emitting elements 23 is not limited to four, but may be one to three, or five or more. Furthermore, a ratio (number ratio) of the number of first light emitting elements 21, the number of second light emitting elements 22, and the number of third light emitting elements 23 is not limited to 1:1:1, but may be a different ratio. Moreover, the arrangement of each of the set of first light emitting elements 21, the set of second light emitting elements 22, the set of third light emitting elements 23 is not limited to a single line, but may be a plurality of lines, a matrix, or a zigzag.

[Sealing Member]

First sealing member 31 is provided on the first principal surface of substrate 10 to cover first light emitting elements 21. First sealing member 31 according to the present embodiment is provided linearly along an arrangement direction of first light emitting elements 21 in such a manner as to collectively seal first light emitting elements 21 arranged in a line.

First sealing member 31 comprises a wavelength conversion material and a light-transmitting material. The wavelength conversion material converts a wavelength of light emitted by first light emitting elements 21. The light-transmitting material includes the wavelength conversion material.

The light-transmitting material in first sealing member 31 can be a light-transmitting insulating resin material, such as a silicone resin, an epoxy resin or a fluorine resin, for example. The light-transmitting material is not necessarily limited to an organic material, such as a resin material, but may be an inorganic material, such as a low melting glass or a sol-gel glass.

Furthermore, the wavelength conversion material in first sealing member 31 converts a wavelength of the light emitted by first light emitting elements 21 to generate light having a wavelength different from the original wavelength of the light emitted by first light emitting elements 21. The wavelength conversion material thereby outputs the resulting light as wavelength-converted light. The wavelength conversion material is, for example, a phosphor that is excited by the light emitted by first light emitting elements 21 to emit fluorescent having a desired color (wavelength).

According to the present embodiment, since each of first light emitting elements 21 is a blue LED chip, the phosphor can be, for example, an yttrium-aluminum-garnet (YAG) yellow phosphor in order to obtain white light. In this way, a portion of blue light emitted by the blue LED chips is absorbed in the yellow phosphor, and a wavelength of the portion of blue light is converted to a wavelength of yellow light. In other words, the yellow phosphor is excited by the blue light of the blue LED chips to emit the yellow light. This yellow light of the yellow phosphor and the other portion of the blue light that is not absorbed in the yellow phosphor are combined to generate white light as synthesized light. As a result, first sealing member 31 outputs the white light.

First sealing member 31 according to the present embodiment is a phosphor-containing resin obtained by dispersing a yellow phosphor in a silicone resin. Such first sealing member 31 can be formed into a predetermined shape by applying sealing member 31 to substrate 10 using a dispenser, followed by curing. First sealing member 31 having the above-described structure, is semi-cylindrical, and a cross-section of first sealing member 31 taken along a plane perpendicular to a longitudinal direction of first sealing member 31 is substantially semi-circular.

Second sealing member 32 is provided on the first principal surface of substrate 10 to cover second light emitting elements 22. Second sealing member 32 according to the present embodiment is provided linearly along an arrangement direction of second light emitting elements 22 in such a manner as to collectively seal second light emitting elements 22 arranged in a line.

Like first sealing member 31, second sealing member 32 also comprises a wavelength conversion material and a light-transmitting material. The wavelength conversion material converts a wavelength of light emitted by second light emitting elements 22, and the light-transmitting material includes the wavelength conversion material.

The light-transmitting material and the wavelength conversion material in second sealing member 32 can be the same as the light-transmitting material and the wavelength conversion material in first sealing member 31. Like first sealing member 31, second sealing member 32 according to the present embodiment is a phosphor-containing resin obtained by dispersing a yellow phosphor in a silicone resin. Therefore, second sealing member 32 can be formed by the same method as the method for forming first sealing member 31.

In the same manner as first sealing member 31, in second sealing member 32 having the above-described structure, the yellow phosphor converts a wavelength of a portion of blue-green light emitted by second light emitting elements 22 that are blue-green LED chips to generate yellow light. Then, this yellow light of the yellow phosphor and the other portion of the blue-green light of second light emitting elements 22 which is not wavelength-converted in the yellow phosphor are combined to generate white light. As a result, first sealing member 32 outputs the white light.

Although second light emitting elements 22 emit light in the blue light emission range in the similar manner to first light emitting elements 21, the light of second light emitting elements 22 is blue-green light that has a wavelength longer than the wavelength of the light of first light emitting elements 21. Therefore, the white light outputted from second sealing member 32 is slightly blue-greenish.

Third sealing member 33 is provided on the first principal surface of substrate 10 to cover third light emitting elements 23. Third sealing member 33 according to the present embodiment is provided linearly along an arrangement direction of third light emitting elements 23 in such a manner as to collectively seal third light emitting elements 23 arranged in a line.

Third sealing member 33 comprises a light-transmitting material. The light-transmitting material in third sealing member 33 can be the same as the light-transmitting material in first sealing member 31. According to the present embodiment, third sealing member 33 is a silicone resin. Therefore, third sealing member 33 can also be formed by the same method as the method for forming first sealing member 31.

According to the present embodiment, third sealing member 33 does not include a wavelength conversion material (phosphor). Therefore, red light of third light emitting elements 23 is outputted from third sealing member 33 by passing through the light-transmitting material without being wavelength-converted.

It should be noted that third sealing member 33 may include a wavelength conversion material in order to increase color rendering or the like. Moreover, in order to simplify the manufacturing process, the material of third sealing member 33 may be the same as the material of first sealing member 31 and second sealing member 32. However, even if third sealing member 33 includes a yellow phosphor, yellow light is hardly generated by third sealing member 33. This is because a phosphor (yellow phosphor or the like) that emits fluorescent having a wavelength shorter than the wavelength of red light is hardly excited by red light of third light emitting elements 23 that are red LED chips.

Although first sealing member 31, second sealing member 32, and third sealing member 33 are formed as above, it is also possible to form each of first sealing member 31, second sealing member 32, and third sealing member 33 by dispersing a light diffusion material, such as silica grains, in the sealing member.

Furthermore, according to the present embodiment, although the wavelength conversion material (yellow phosphor) is included in both first sealing member 31 and second sealing member 32, it is also possible that the wavelength conversion material (yellow phosphor) may be included in either first sealing member 31 or second sealing member 32. In this case, since first light emitting elements 21 emits light having a wavelength shorter than the wavelength of the light of second light emitting elements 22, it is preferable that the wavelength conversion material (yellow phosphor) is included in first sealing member 31. Light of light emitting elements sealed by a sealing member not including a wavelength conversion material (yellow phosphor) is outputted from the sealing member without being wavelength-converted. For example, if second sealing member 32 does not include the wavelength conversion material, blue-green light of second light emitting elements 22 is outputted from second sealing member 32 by passing through the light-transmitting material without being wavelength-converted.

Moreover, it has been described in the present embodiment that a plurality of first light emitting elements 21 are sealed by single first sealing member 31, a plurality of second light emitting elements 22 are sealed by single second sealing member 32, and a plurality of third light emitting elements 23 are sealed by single third sealing member 33. However, it is also possible that each of these light emitting elements is sealed individually by a single sealing member.

It is further possible that all of first light emitting elements 21, second light emitting elements 22, and third light emitting elements 23 are sealed by first sealing member 31 including the yellow phosphor. For example, all the light emitting elements on substrate 10 may be sealed by first sealing member 31.

[Emission Spectrum of Light Emitting Device]

The following describes characteristics of an emission spectrum of light emitting device 1 according to the present embodiment.

In light emitting device 1 having the above-described structure, when DC power is supplied via the pair of feed terminals 11, then first light emitting elements 21, second light emitting elements 22, and third light emitting elements 23 emit light, and therefore the lights of predetermined different colors (wavelengths) described previously are outputted from first sealing member 31, second sealing member 32, and third sealing member 33.

In this case, the lights outputted from these sealing members are mixed to be white light, and light emitting device 1 as a whole outputs the white light having a predetermined emission spectrum.

Since light emitting device 1 has the set of first light emitting elements 21 and the set of second light emitting elements 22, an emission spectrum of the entire light outputted from light emitting device 1 has a plurality of peaks at: a first peak wavelength corresponding to an emission peak wavelength of first light emitting elements 21; and a second peak wavelength corresponding to an emission peak wavelength of second light emitting elements 22.

In light emitting device 1, each of the emission spectrum of first light emitting elements 21 and the emission spectrum of second light emitting elements 22 has a corresponding peak at a wavelength that is within a range of 440 nm to 495 nm (blue light emission range). Therefore, in the emission spectrum of light emitting device 1, the first peak wavelength and the second peak wavelength are within the range of 440 nm to 495 nm which is the blue light emission range.

Furthermore, in the emission spectrum of light emitting device 1, where a light intensity at one of the first peak wavelength and the second peak wavelength is 1, a light intensity at a bottom of a valley between the first peak wavelength and the second peak wavelength is 0.5 or higher but lower than 1.0.

More specifically, in light emitting device 1, by decreasing a peak distance (peak-to-peak) between the two peak wavelengths, which are the first peak wavelength and the second peak wavelength within the range of 440 nm to 495 nm (blue light emission range), the emission spectrum of light emitting device 1 can be adjusted so that a light intensity at a bottom of a valley between the two peak wavelengths is at least 0.5 times a light intensity at one of the two peak wavelengths but below the light intensity at one of the two peak wavelengths.

Furthermore, it is preferable that the light intensity at the bottom of the valley between the first peak wavelength and the second peak wavelength is 0.8 or higher but lower than 1.0, where the light intensity at one of the first peak wavelength and the second peak wavelength is 1.

According to the present embodiment, the emission peak wavelength of second light emitting elements 22 is longer than the emission peak wavelength of first light emitting elements 21. Therefore, in the emission spectrum of light emitting device 1, the second peak wavelength corresponding to the emission peak wavelength of second light emitting elements 22 is longer than the first peak wavelength corresponding to the emission peak wavelength of first light emitting elements 21. In the emission spectrum of light emitting device 1, a light intensity at the second peak wavelength that is longer than the first peak wavelength is higher than a light intensity at the first peak wavelength that is shorter than the second peak wavelength.

In this case, according to the present embodiment, where the light intensity at the first peak wavelength that is shorter than the second peak wavelength is 1, the light intensity at the second peak wavelength that is longer than the first peak wavelength is higher than 1.0 but no higher than 2.0. More specifically, the emission spectrum is adjusted so that, among the first peak wavelength and the second peak wavelength which are within a range from 440 nm to 495 nm (blue light emission range), a longer peak wavelength has a light intensity that is higher than a light intensity at the shorter peak wavelength but no higher than double the light intensity at the shorter peak wavelength.

According to the present embodiment, since third light emitting elements 23 are further provided, the emission spectrum of light emitting device 1 further has a peak of a third peak wavelength corresponding to the emission peak wavelength of third light emitting elements 23.

In light emitting device 1, the emission spectrum of third light emitting elements 23 has a peak at the wavelength within a range of 620 nm to 750 nm which is a red light emission range. Therefore, in the emission spectrum of light emitting device 1, the third peak wavelength is within the range of 620 nm to 750 nm which is the red light emission range.

The following describes four examples of the emission spectrum of light emitting device 1 according to the present embodiment, and color rendering of the four examples, with reference to FIGS. 2A to 5B. It should be noted that, in the following examples, third light emitting elements 23 are red LED chips that emit light having an emission peak wavelength of 630 nm.

Figure 2A:
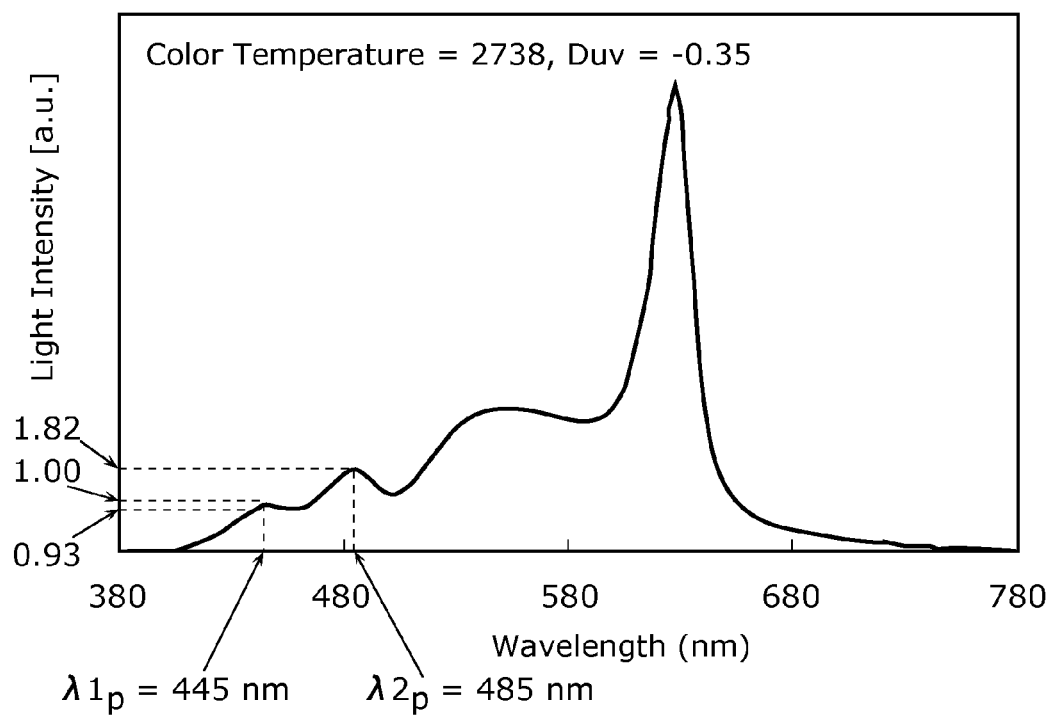
FIG. 2A is a graph plotting a first example of an emission spectrum of the light emitting device according to the first embodiment.

First, FIG. 2A plots an emission spectrum adjusted to have a color temperature of 2738 (K) regarding light emitting device 1. Here, light emitting device 1 includes first light emitting elements 21 that emit blue light having an emission peak wavelength ($\lambda 1_p$) of 445 nm, and second light emitting elements 22 that emit blue-green light having an emission peak wavelength ($\lambda 2_p$) of 485 nm. It should be noted that Duv, which indicates a deviation from a black-body radiation track, is −0.35.

In this example of the emission spectrum of light emitting device 1, where a light intensity at the first peak wavelength, which corresponds to the emission peak wavelength of first light emitting elements 21 and is shorter than the second peak wavelength, is 1, a light intensity at a bottom of a valley between the first peak wavelength ($\lambda 1_p$) and the second peak wavelength ($\lambda 2_p$) is 0.93, and a light intensity at the second peak wavelength ($\lambda 2_p$) is 1.82.

FIG. 2B shows color rendering indexes of light emitting device 1 having the emission spectrum seen in FIG. 2A. More specifically, FIG. 2B shows color rendering indexes of eight colors (R1 to R8), an average color rendering index (Ra) that is an average of the eight-color color rendering indexes, and special color rendering indexes (R9 to R15).

As seen in FIG. 2B, all the color rendering indexes each have a value greater than 90, which indicates high color rendering. In particular, special color rendering index R12 regarding blue also has a value of 90 or greater.

Furthermore, according to the present embodiment, third light emitting elements 23 are red LED chips. Therefore, special color rendering index R9 regarding red also has a value of 90 or greater.

Figure 3A:
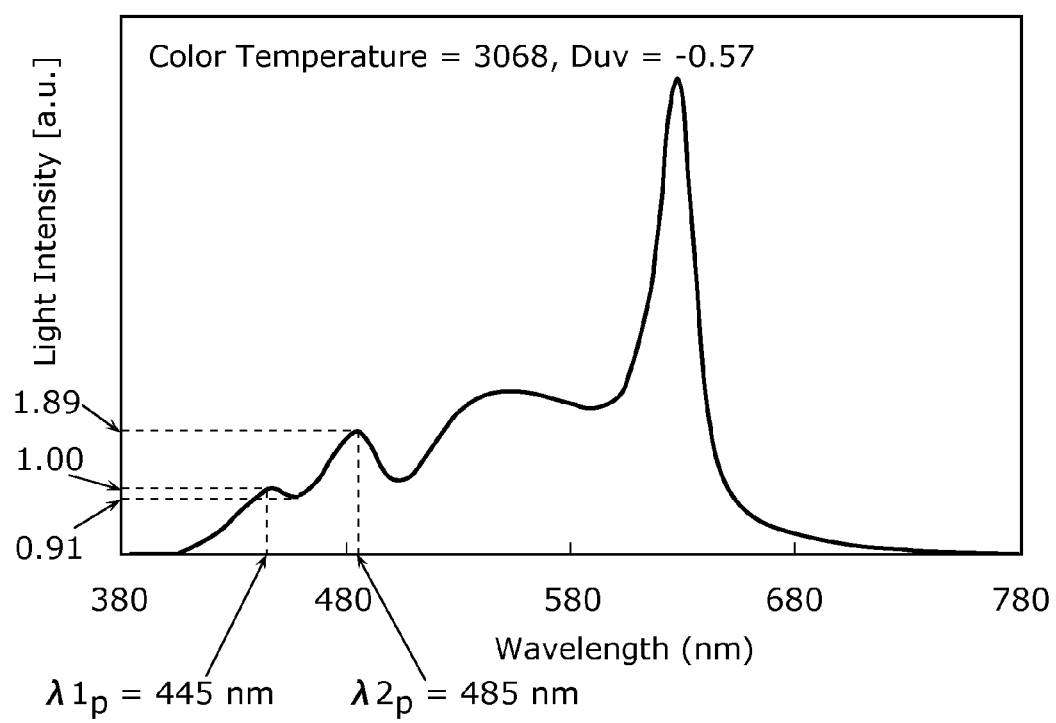
FIG. 3A is a graph plotting a second example of an emission spectrum of the light emitting device according to the first embodiment.

Next, FIG. 3A plots an emission spectrum adjusted to have a color temperature of 3068 (K) regarding light emitting device 1. Here, light emitting device 1 includes first light emitting elements 21 that emit blue light having an emission peak wavelength ($\lambda 1_p$) of 445 nm, and second light emitting elements 22 that emit blue-green light having an emission peak wavelength ($\lambda 2_p$) of 485 nm. Note that Duv is −0.57.

In this example of the emission spectrum of light emitting device 1, where a light intensity at the first peak wavelength, which corresponds to the emission peak wavelength of first light emitting elements 21 and is shorter than the second peak wavelength, is 1, a light intensity at a bottom of a valley between the first peak wavelength ($\lambda 1_p$) and the second peak wavelength ($\lambda 2_p$) is 0.91, and a light intensity at the second peak wavelength ($\lambda 2_p$) is 1.89.

FIG. 3B shows color rendering indexes of light emitting device 1 having the emission spectrum seen in FIG. 3A. As seen in FIG. 3B, like the previous example, all the color rendering indexes each have a value greater than 90, which indicates high color rendering. Furthermore, special color rendering index R12 regarding blue and special color rendering index R9 regarding red each also have a value of 90 or greater.

Figure 4A:
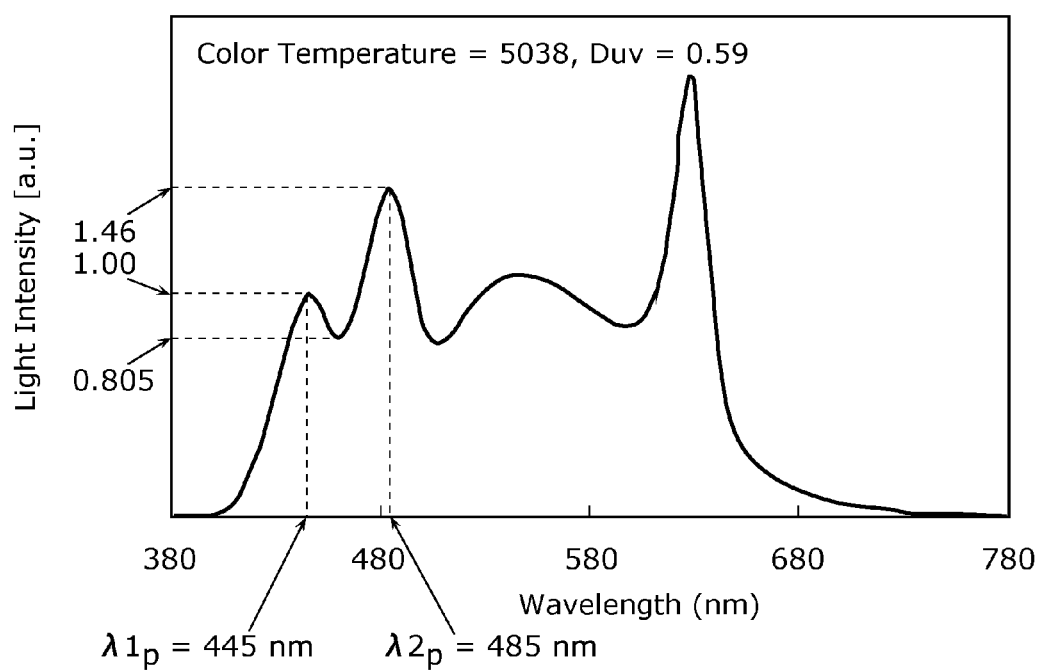
FIG. 4A is a graph plotting a third example of an emission spectrum of the light emitting device according to the first embodiment.

Next, FIG. 4A plots an emission spectrum adjusted to have a color temperature of 5038 (K) regarding light emitting device 1. Here, light emitting device 1 includes first light emitting elements 21 that emit blue light having an emission peak wavelength ($\lambda 1_p$) of 445 nm, and second light emitting elements 22 that emit blue-green light having an emission peak wavelength ($\lambda 2_p$) of 485 nm. Note that Duv is 0.59.

In this example of the emission spectrum of light emitting device 1, where a light intensity at the first peak wavelength, which corresponds to the emission peak wavelength of first light emitting elements 21 and is shorter than the second peak wavelength, is 1, a light intensity at a bottom of a valley between the first peak wavelength ($\lambda 1_p$) and the second peak wavelength ($\lambda 2_p$) is 0.805, and a light intensity at the second peak wavelength ($\lambda 2_p$) is 1.46.

FIG. 4B shows color rendering indexes of light emitting device 1 having the emission spectrum seen in FIG. 4A. As seen in FIG. 4B, like the previous examples, all the color rendering indexes each have a value of 90 or greater, which indicates high color rendering. Furthermore, special color rendering index R12 regarding blue and special color rendering index R9 regarding red each also have a value of 90 or greater.

Figure 5A:
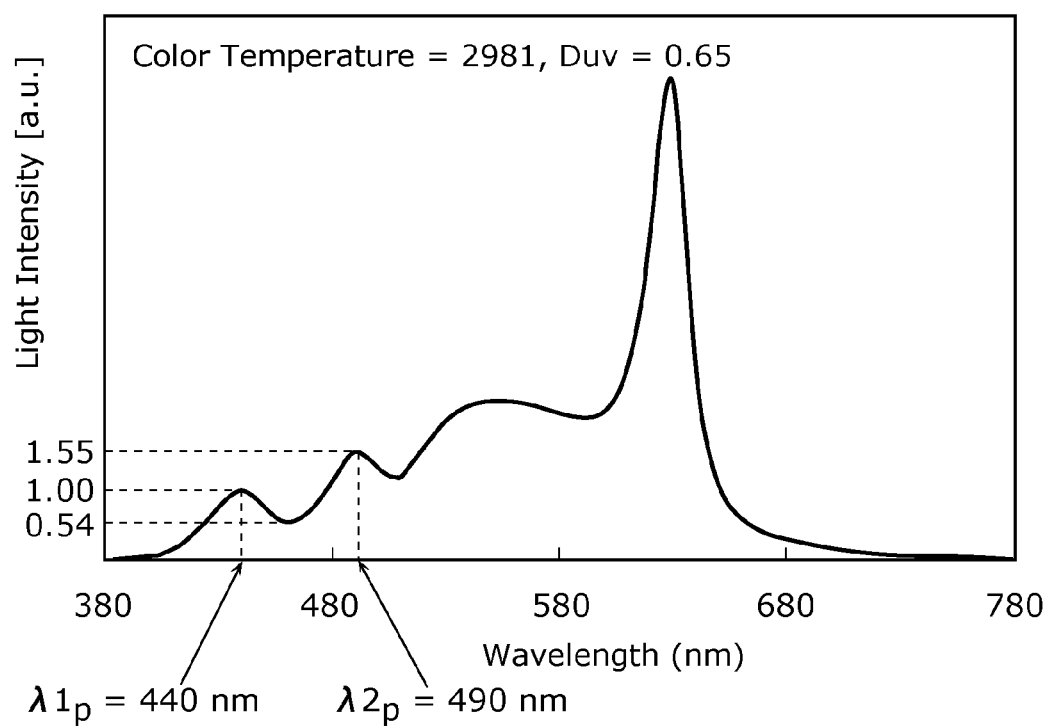
FIG. 5A is a graph plotting a fourth example of an emission spectrum of the light emitting device according to the first embodiment.

Next, FIG. 5A plots an emission spectrum adjusted to have a color temperature of 2981 (K) regarding light emitting device 1. Here, light emitting device 1 includes first light emitting elements 21 that emit blue light having an emission peak wavelength ($\lambda 1_p$) of 440 nm, and second light emitting elements 22 that emit blue-green light having an emission peak wavelength ($\lambda 2_p$) of 490 nm. Note that Duv is 0.65.

In this example of the emission spectrum of light emitting device 1, where a light intensity at the first peak wavelength, which corresponds to the emission peak wavelength of first light emitting elements 21 and is shorter than the second peak wavelength, is 1, a light intensity at a bottom of a valley between the first peak wavelength ($\lambda 1_p$) and the second peak wavelength ($\lambda 2_p$) is 0.54, and a light intensity at the second peak wavelength ($\lambda 2_p$) is 1.55.

FIG. 5B shows color rendering indexes of light emitting device 1 having the emission spectrum seen in FIG. 5A. As seen in FIG. 5B, like the previous examples, all the color rendering indexes each have a value of 90 or greater, which indicates high color rendering. Furthermore, special color rendering index R12 regarding blue and special color rendering index R9 regarding red each also have a value of 90 or greater.

As described with reference to the above four examples, light emitting device 1 according to the present embodiment includes the set of first light emitting elements 21 and the set of second light emitting elements 22 which have different emission peak wavelengths within a range of 440 nm to 495 nm. Furthermore, at least one of first sealing member 31 and second sealing member 32 in light emitting device 1 includes a wavelength conversion material that converts a wavelength of light emitted by the set of first light emitting elements 21 or a wavelength of light emitted by the set of second light emitting elements 22.

The emission spectrum of light emitting device 1 having the above-described structure has two peaks within a range of 440 nm to 495 nm. The two peaks are the first peak wavelength corresponding to the emission peak wavelength of first light emitting elements 21 and the second peak wavelength corresponding to the emission peak wavelength of second light emitting elements 22. Furthermore, in the emission spectrum of light emitting device 1, where a light intensity at one of the first peak wavelength and the second peak wavelength is 1, a light intensity at a bottom of a valley between the first peak wavelength and the second peak wavelength is 0.5 or higher but lower than 1.0.

This structure allows each of all the color rendering indexes of light emitting device 1 to have a value of 90 or greater. As a result, light emitting device 1 can offer high color rendering. In particular, having two kinds of light emitting elements each having an emission peak wavelength within the blue light emission range, light emitting device 1 increases special color rendering index R12 that is low in conventional light emitting devices. In addition, light emitting device 1 can improve light emission efficiency in comparison to the case where color rendering is improved by a phosphor.

Furthermore, in the three examples seen in FIGS. 2A to 4B, where a light intensity at one of the first peak wavelength and the second peak wavelength is 1, a light intensity at a bottom of a valley between the first peak wavelength and the second peak wavelength is 0.8 or higher but lower than 1.0. As a result, the average color rendering index and special color rendering index R12 can be improved in appropriate balance.

Moreover, in the two examples seen in FIGS. 2A to 3B, where a light intensity at one of the first peak wavelength and the second peak wavelength is 1, a light intensity at a bottom of a valley between the first peak wavelength and the second peak wavelength is 0.9 or higher. This means that special color rendering index R12 can be considerably increased.

Furthermore, in light emitting device 1 according to the present embodiment, the second peak wavelength corresponding to the emission peak wavelength of second light emitting elements 22 is longer than the first peak wavelength corresponding to the emission peak wavelength of first light emitting elements 21. In addition, the light intensity at the second peak wavelength is higher than the light intensity at the first peak wavelength.

This means that the emission spectrum of light emitting device 1 is close to a spectrum of blackbody radiation. This means that color rendering is improved.

Furthermore, in this case, according to the present embodiment, where the light intensity at the first peak wavelength that is shorter than the second peak wavelength is 1, the light intensity at the second peak wavelength that is longer than the first peak wavelength is higher than 1.0 but no higher than 2.0.

Therefore, it is possible to easily increase special color rendering index R12, and to easily set each of all the color rendering indexes of light emitting device 1 to have a value of 90 or greater. As a result, it is possible to easily provide a light emitting device with high color rendering.

Furthermore, light emitting device 1 according to the present embodiment includes third light emitting elements 23 that are red LED chips. Therefore, light emitting device 1 can supplement reddish component to white light, unlike light emitting devices that are not provided with red LED chip(s) and therefore generate white light only by blue LED chip(s) and a yellow phosphor. Therefore, light emitting device 1 according to the present embodiment can offer higher color rendering than that of light emitting devices without red LED chip(s).

In order to supplement red light to white light, there are methods; a method using red light emitted by a red phosphor excited by light of blue LED chips, and a method directly using red light emitted by red LED chips. In general, in terms of power-light conversion efficiency, the former is inferior to the latter. In order to solve the drawback, light emitting device 1 according to the present embodiment uses red LED chips not a red phosphor, so that light emission efficiency is improved in comparison to the case using a red phosphor. Therefore, as light emitting device 1 according to the present embodiment, if red LED chips are added to a combination of blue LED chip(s) and a yellow phosphor, light emission efficiency is improved in comparison to light emitting devices having a red phosphor added to the combination of blue LED chip(s) and a yellow phosphor.

Variation of First Embodiment

Figure 6A:
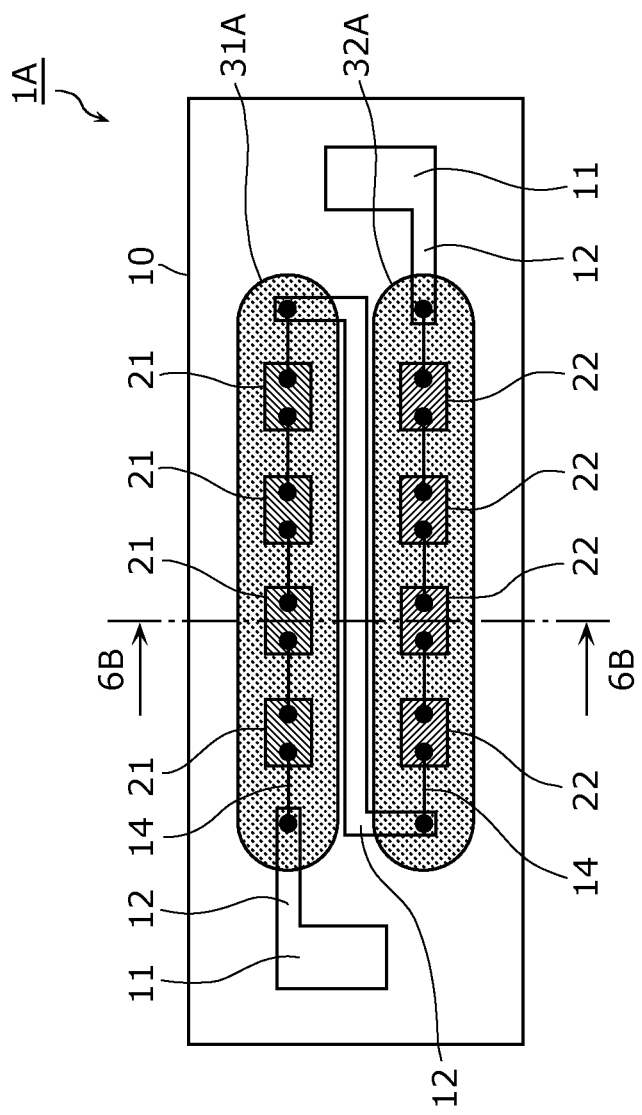
FIG. 6A is a plan view of a light emitting device according to a variation of the first embodiment.

Now, light emitting device 1A according to a variation of the first embodiment will be described with reference to FIGS. 6A and 6B. FIG. 6A is a plan view of light emitting device 1A according to the present variation, and FIG. 6B is a sectional view of light emitting device 1A taken along line 6B-6B in FIG. 6A.

It has been described in the first embodiment described that third light emitting elements 23, which are red LED chips, are provided. However, in the present variation of the first embodiment, third light emitting elements 23 are not provided. Instead, in the present variation, a red phosphor is provided to supplement reddish component of white light.

More specifically, as illustrated in FIGS. 6A and 6B, in light emitting device 1A according to the present variation of the first embodiment, a red phosphor is included in each of first sealing member 31A sealing first light emitting elements 21 and second sealing member 32A sealing second light emitting elements 22.

According to the present variation, first sealing member 31A has a structure where first sealing member 31 according to the first embodiment is added with a red phosphor. As an example, first sealing member 31A is a phosphor-containing resin obtained by dispersing a yellow phosphor and a red phosphor in a silicone resin.

As described above, since first sealing member 31A according to the present variation includes not only the yellow phosphor but also the red phosphor, a portion of blue light emitted by first light emitting elements 21 that are blue LED chips is wavelength-converted in the yellow phosphor and the red phosphor to be yellow light and red light, respectively. Then, the yellow light, the red light, and the other portion of the blue light which is emitted by first light emitting elements 21 but not wavelength-converted in the yellow phosphor and the red phosphor, are mixed to be white light. As a result, first sealing member 31A outputs the resulting white light.

Likewise, second sealing member 32A has the structure where second sealing member 32 according to the first embodiment is added with a red phosphor. As an example, second sealing member 32A is a phosphor-containing resin obtained by dispersing a yellow phosphor and a red phosphor in a silicone resin.

As described above, second sealing member 32A according to the present variation includes the red phosphor in addition to the yellow phosphor, so that a portion of blue-green light emitted by second light emitting elements 22 that are blue-green LED chips is wavelength-converted in the yellow phosphor and the red phosphor to be yellow light and red light, respectively. Then, the yellow light, the red light, and the other portion of the blue-green light of second light emitting elements 22 which is not wavelength-converted in the yellow phosphor and the red yellow phosphor are combined to generate white light. As a result, second sealing member 32A outputs the white light.

Although it has been described in the present variation that the red phosphor is included in both first sealing member 31A and second sealing member 32A, the red phosphor may be included in either first sealing member 31A or second sealing member 32A. In this case, since first light emitting elements 21 emit light having a wavelength shorter than the wavelength of light of second light emitting elements 22, the red phosphor is preferably included in first sealing member 31A. Furthermore, in the same manner as described in the first embodiment, the yellow phosphor may also be included in either first sealing member 31A or second sealing member 32A.

As described above, in the same manner as described in the first embodiment, light emitting device 1A according to the present variation has first light emitting elements 21 and second light emitting elements 22 which emit lights having different emission peak wavelengths within a range of 440 nm to 495 nm, and at least one of first sealing member 31A and second sealing member 32A includes a wavelength conversion material that converts a wavelength of light emitted by first light emitting elements 21 or second light emitting elements 22.

In the same manner as described in the first embodiment, the emission spectrum of light emitting device 1A having the above-described structure has two peaks within a range of 440 nm to 495 nm. The two peaks are the first peak wavelength corresponding to the emission peak wavelength of first light emitting elements 21 and the second peak wavelength corresponding to the emission peak wavelength of second light emitting elements 22. Furthermore, where a light intensity at one of the first peak wavelength and the second peak wavelength is 1, a light intensity at a bottom of a valley between the first peak wavelength and the second peak wavelength is 0.8 or higher but lower than 1.0.

In the same manner as described in the first embodiment, this structure allows each of all the color rendering indexes of light emitting device 1A to have a value of 90 or greater. As a result, light emitting device 1A can offer high color rendering. In particular, having two kinds of light emitting elements each having an emission peak wavelength within the blue light emission range, light emitting device 1A can increase special color rendering index R12. In addition, light emitting device 1A can improve light emission efficiency in comparison to the case where color rendering is improved by a phosphor.

Also in light emitting device 1A according to the present variation, where a light intensity at the first peak wavelength that is shorter than the second peak wavelength is 1, a light intensity at the second peak wavelength that is longer than the first peak wavelength is higher than 1.0 but no higher than 2.0.

Therefore, it is possible to easily set each of all the color rendering indexes including special color rendering index R12 of light emitting device 1A to have a value of 90 or greater. As a result, light emitting device 1A can offer high color rendering.

Furthermore, since light emitting device 1A according to the present variation includes the red phosphor in first sealing member 31A or second sealing member 32A, light emitting device 1A can supplement reddish component to white light, unlike light emitting devices that are not provided with a red phosphor and therefore generate white light only by blue LED chip(s) and a yellow phosphor. As a result, in comparison to light emitting devices without a red phosphor, light emitting device 1A according to the present variation can offer higher color rendering.

Although it has been described in the present variation that the red phosphor is used to supplement reddish component, it is also possible to use, instead of the red phosphor, a wavelength conversion material that generates red light from the light of first light emitting elements 21 or second light emitting elements 22.

Second Embodiment

Figure 7A:
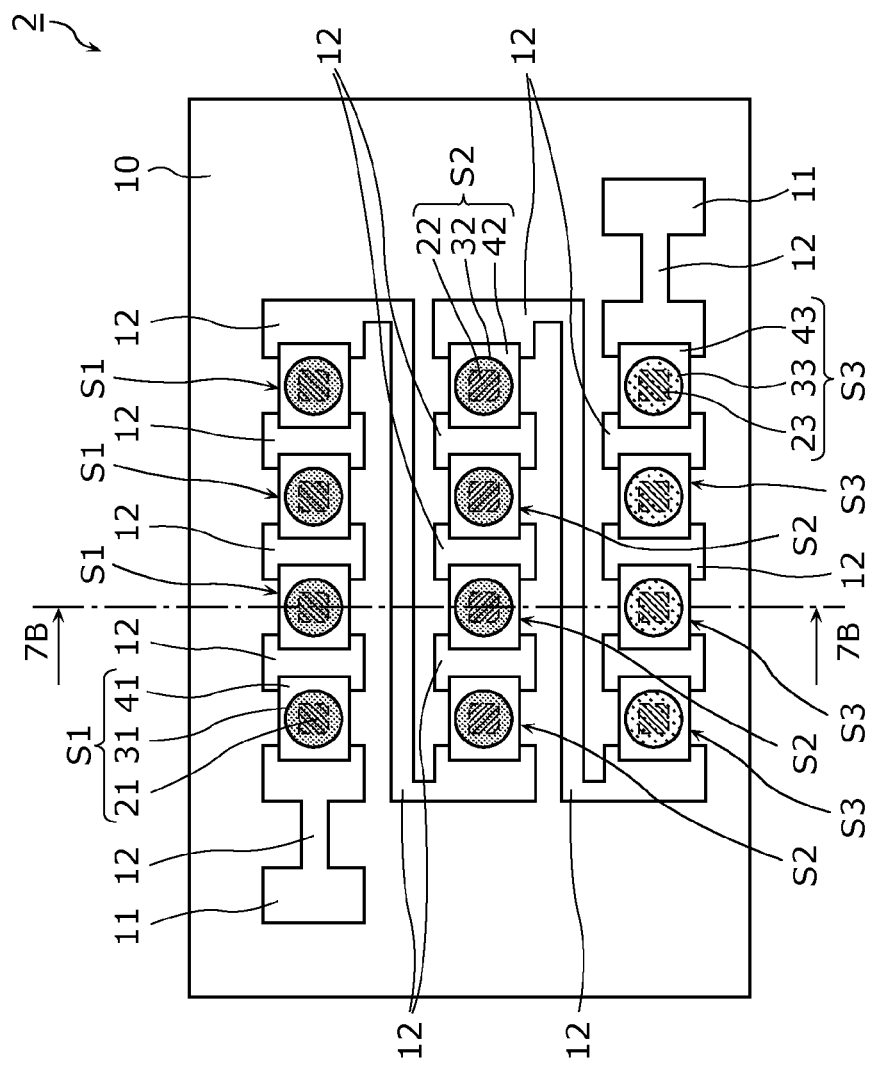
FIG. 7A is a plan view of a light emitting device according to a second embodiment.
Figure 7B:
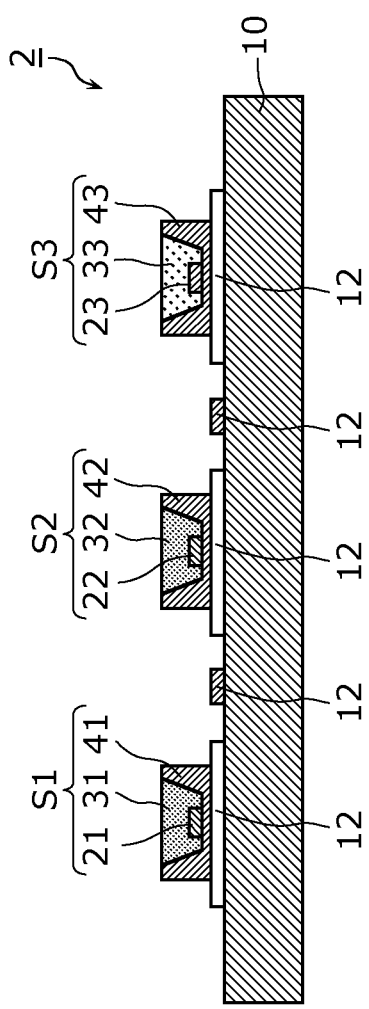
FIG. 7B is a sectional view of the light emitting device according to the second embodiment, taken along line 7B-7B in FIG. 7A.

Next, light emitting device 2 according to a second embodiment will be described with reference to FIGS. 7A and 7B. FIG. 7A is a plan view of light emitting device 2. FIG. 7B is a sectional view of light emitting device 2 taken along line 7B-7B in FIG. 7A.

It has been described in the first embodiment that light emitting elements are LED chips. According to the second embodiment, these light emitting elements are in surface mount device (SMD) LED elements. In other words, in the second embodiment, SMD LED elements which are LED chips individually packaged are used.

As illustrated in FIGS. 7A and 7B, light emitting device 2 according to the second embodiment includes substrate 10, a plurality of first LED elements S1, a plurality of second LED elements S2, and a plurality of third LED elements S3.

Each of first LED elements S1 includes first container 41, first light emitting element 21 mounted in first container 41, and first sealing member 31 sealing first light emitting element 21.

Each of second LED elements S2 includes second container 42, second light emitting element 22 mounted in second container 42, and second sealing member 32 sealing second light emitting element 22.

Each of third LED elements S3 includes third container 43, third light emitting element 23 mounted in third container 43, and third sealing member 33 sealing third light emitting element 23.

First containers 41, second containers 42, and third containers 43 are packages each formed of, for example, white resin and having a cavity. For example, first containers 41, second containers 42, and third containers 43 may be lead frame packages. Furthermore, each of first containers 41, second containers 42, and third containers 43 has a cavity with inclined internal side surface, so that light outputted from each of first containers 41, second containers 42, and third containers 43 is reflected on the internal side surface to travel upward. First light emitting elements 21, second light emitting elements 22, and third light emitting elements 23 are the same as those described in the first embodiment. First sealing members 31, second sealing members 32, and third sealing members 33 are made of the same material as that described in the first embodiment. Each of first sealing members 31, second sealing members 32, and third sealing members 33 is filled in a container to seal a light emitting device.

First LED elements S1, second LED elements S2, and third LED elements S3 are mounted on substrate 10. More specifically, each of first LED elements S1, second LED elements S2, and third LED elements S3 is soldered to corresponding metal wire 12 on substrate 10 to be electrically connected to metal wire 12.

According to the present embodiment, first LED elements S1, second LED elements S2, and third LED elements S3 are electrically connected in series to each other. In other words, also in the present embodiment, all of first light emitting elements 21, second light emitting elements 22, and third light emitting elements 23 are electrically connected in series to each other.

Although four first LED elements S1, four second LED elements S2, and four third LED elements S3 are illustrated, each of the number of first LED elements S1, the number of second LED elements S2, and the number of third LED elements S3 is not limited to four, but may be one to three, or five or more. Furthermore, a ratio (number ratio) of the number of first LED elements S1, the number of second LED elements S2, and the number of third LED elements S3 is not limited to 1:1:1, but may be a different ratio.

In the same manner as described in the first embodiment, light emitting device 2 according to the present embodiment has first light emitting element 21 and second light emitting element 22 which emit lights having different emission peak wavelengths within a range of 440 nm to 495 nm. Furthermore, at least one of first sealing member 31 and second sealing member 32 includes a wavelength conversion material that converts a wavelength of light emitted by first light emitting element 21 or a wavelength of light emitted by second light emitting element 22.

In the same manner as described in the first embodiment, the emission spectrum of light emitting device 2 having the above-described structure has two peaks within a range of 440 nm to 495 nm. The two peaks are the first peak wavelength corresponding to the emission peak wavelength of first light emitting elements 21 and the second peak wavelength corresponding to the emission peak wavelength of second light emitting elements 22. Where a light intensity at one of the first peak wavelength and the second peak wavelength is 1, a light intensity at a bottom of a valley between the first peak wavelength and the second peak wavelength is 0.8 or higher but lower than 1.0.

In the same manner as described in the first embodiment, this structure allows each of all the color rendering indexes of light emitting device 2 to have a value of 90 or greater. As a result, light emitting device 2 can offer high color rendering. In particular, having two kinds of light emitting elements each having an emission peak wavelength within the blue light emission range, light emitting device 2 can increase special color rendering index R12 and improve light emission efficiency in comparison to the case where color rendering is improved by a phosphor.

Also in light emitting device 2 according to the present embodiment, where a light intensity at the first peak wavelength that is shorter than the second peak wavelength is 1, a light intensity at the second peak wavelength that is longer than the first peak wavelength is higher than 1.0 but no higher than 2.0.

Therefore, it is possible to easily set each of all the color rendering indexes including special color rendering index R12 of light emitting device 2 to have a value of 90 or greater. As a result, light emitting device 2 can offer high color rendering.

Furthermore, in the same manner as described in the first embodiment, since light emitting device 2 according to the present embodiment includes third light emitting elements 23 that are red LED chips, light emitting device 2 can supplement reddish component to white light, unlike light emitting devices that are not provided with red LED chip(s) and therefore generate white light only by blue LED chip(s) and a yellow phosphor. Therefore, light emitting device 2 according to the present embodiment can offer higher color rendering than that of light emitting devices without red LED chip(s).

Moreover, in the same manner as described in the first embodiment, light emitting device 2 according to the present embodiment uses red LED chips not a red phosphor, so that light emission efficiency is improved in comparison to the case using a red phosphor.

Variation of Second Embodiment

Figure 8A:
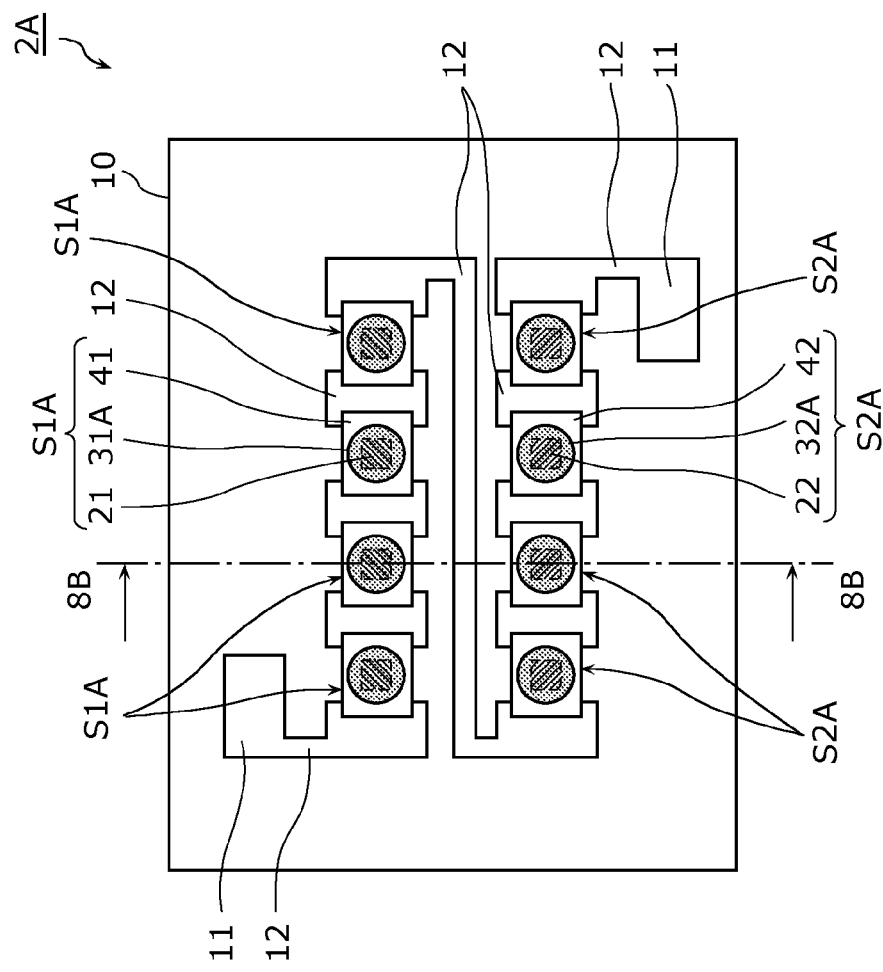
FIG. 8A is a plan view of a light emitting device according to a variation of the second embodiment.

Next, light emitting device 2A according to a variation of the second embodiment will be described with reference to FIGS. 8A and 8B. FIG. 8A is a plan view of the light emitting device according to the variation of the second embodiment, and FIG. 8B is a sectional view of the light emitting device taken along line 8B-8B in FIG. 8A.

It has been described in the second embodiment that third light emitting elements 23, which are red LED chips, are provided. However, in the present variation of the second embodiment, third light emitting elements 23 are not provided. Instead, in the present variation, a red phosphor is provided to supplement reddish component of white light.

Figure 8B:
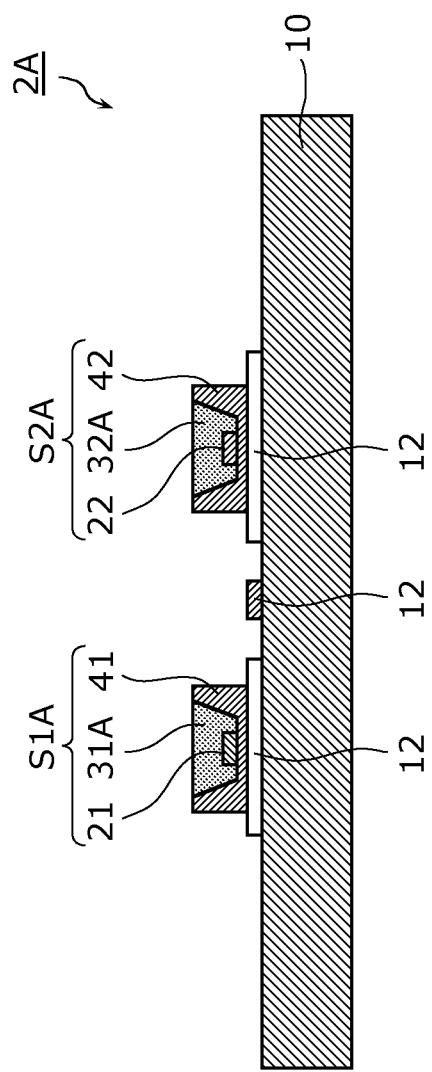
FIG. 8B is a sectional view of the light emitting device according to the variation of the second embodiment, taken along line 8B-8B in FIG. 8A.

More specifically, as illustrated in FIGS. 8A and 8B, in light emitting device 2A according to the present variation, a red phosphor is included in each of first sealing members 31A and second sealing members 32A. First sealing members 31A seal respective first light emitting elements 21. Second sealing members 32A seal respective second light emitting elements 22.

In other word, each of first LED elements S1A includes first container 41, first light emitting element 21, and first sealing member 31A. Furthermore, each of second LED elements S2A includes second container 42, second light emitting element 22, and second sealing member 32A.

Each of first sealing member 31A and second sealing member 32A may have the same structure as that described in the variation of the first embodiment.

In the same manner as described in the second embodiment, light emitting device 2A according to the present variation has first light emitting element 21 and second light emitting element 22 which emit lights having different emission peak wavelengths within a range of 440 nm to 495 nm. Furthermore, at least one of first sealing member 31A and second sealing member 32A includes a wavelength conversion material that converts a wavelength of light emitted by first light emitting element 21 or a wavelength of light emitted by second light emitting element 22.

In the same manner as described in the second embodiment, the emission spectrum of light emitting device 2A having the above-described structure has two peaks within a range of 440 nm to 495 nm. The two peaks are the first peak wavelength corresponding to the emission peak wavelength of first light emitting elements 21 and the second peak wavelength corresponding to the emission peak wavelength of second light emitting elements 22. Furthermore, where a light intensity at one of the first peak wavelength and the second peak wavelength is 1, a light intensity at a bottom of a valley between the first peak wavelength and the second peak wavelength is 0.8 or higher but lower than 1.0.

In the same manner as described in the second embodiment, this structure allows each of all the color rendering indexes of light emitting device 2A to have a value of 90 or greater. As a result, light emitting device 2A can offer high color rendering. In particular, having two kinds of light emitting elements each having an emission peak wavelength within the blue light emission range, light emitting device 2A can increase special color rendering index R12, and improve light emission efficiency in comparison to the case where color rendering is improved by one kind of light emitting elements and a phosphor.

Also in light emitting device 2A according to the present variation, where a light intensity at the first peak wavelength that is shorter than the second peak wavelength is 1, a light intensity at the second peak wavelength that is longer than the first peak wavelength is higher than 1.0 but no higher than 2.0.

Therefore, it is possible to easily set each of all the color rendering indexes including special color rendering index R12 of light emitting device 2A to have a value of 90 or greater. As a result, light emitting device 2A can offer high color rendering.

Furthermore, in the same manner as described in the variation of the first embodiment, since light emitting device 2A according to the present variation includes the red phosphor in first sealing members 31A or second sealing members 32A, light emitting device 2A can offer higher color rendering than that of light emitting devices without a red phosphor.

Third Embodiment

Figure 9:
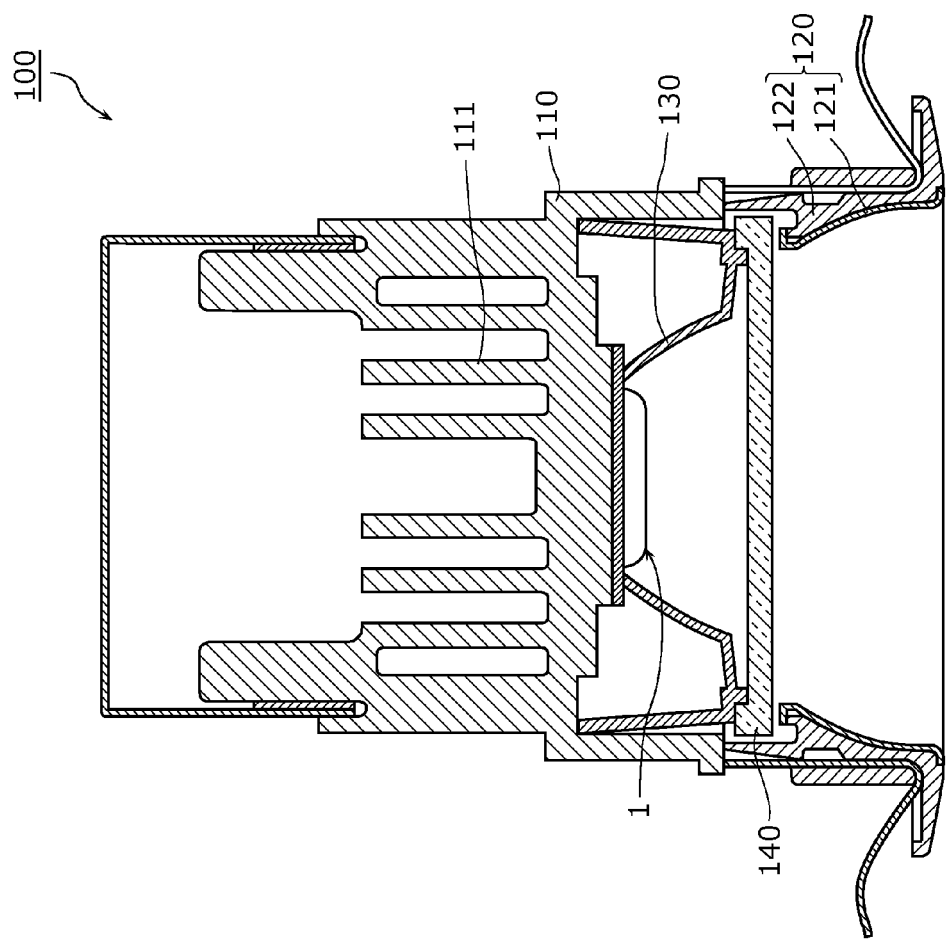
FIG. 9 is a sectional view of an illumination apparatus according to a third embodiment.
Figure 10:
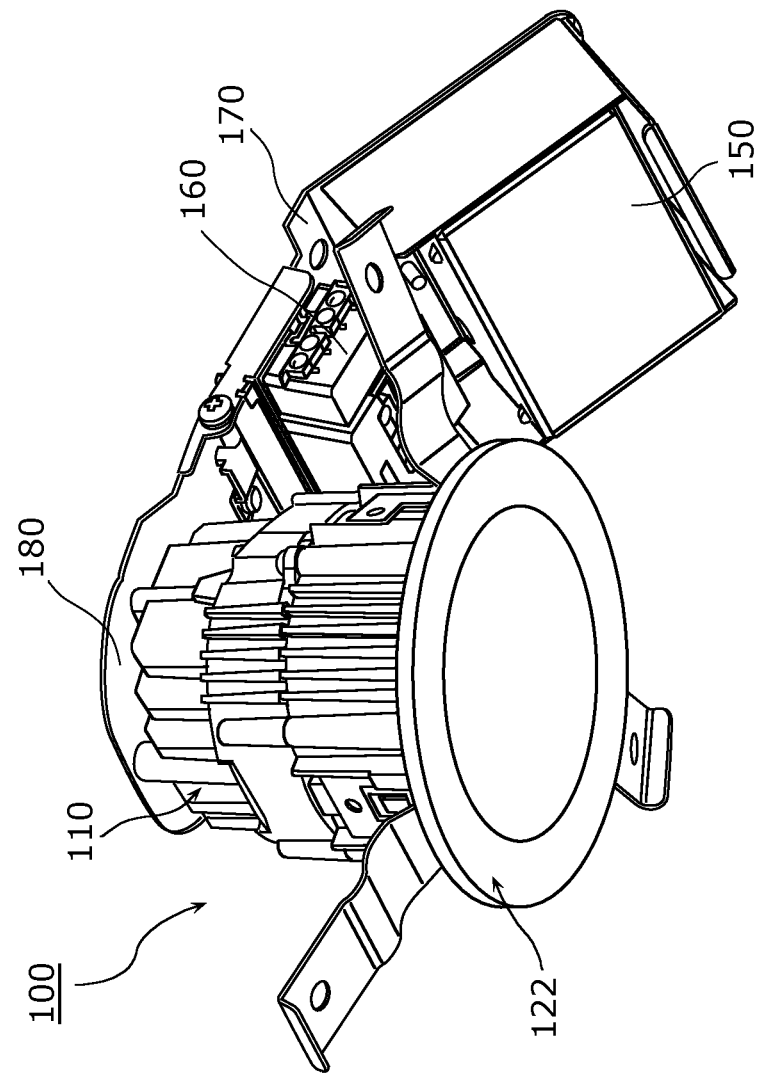
FIG. 10 is an external perspective view of the illumination apparatus according to the third embodiment and peripheral components (a lighting device and a terminal base) connected to the illumination apparatus.

Next, illumination apparatus 100 according to a third embodiment will be described with reference to FIGS. 9 and 10. FIG. 9 is a sectional view of an illumination apparatus according to the third embodiment. FIG. 10 is an external perspective view of the illumination apparatus according to the third embodiment and peripheral components (a lighting device and a terminal base) connected to the illumination apparatus.

As illustrated in FIGS. 9 and 10, illumination apparatus 100 according to the present embodiment is an embedded-type illumination apparatus such as a downlight that is embedded in a ceiling of a house so as to illuminate a downward location (such as a hallway or a wall), for example. Illumination apparatus 110 includes: light emitting device 1 serving as an LED light source; an apparatus main body that is formed by connecting base 110 and frame unit 120 and is substantially shaped as a bottomed tube; and reflector 130 and light-transmitting panel 140 that are mounted to the apparatus main body.

Base 110 serves as not only an attachment base to which light emitting device 1 is attached but also a heat sink that dissipates heat generated in light emitting device 1. Base 110 is formed to have a substantially columnar shape using a metal material and, according to the present embodiment, produced by aluminum die-casting.

In an upper portion (a portion toward the ceiling) of base 110, a plurality of heat dissipation fins 111 that project upward are provided at certain intervals along a single direction. This makes it possible to efficiently dissipate the heat generated in light emitting device 1.

Frame unit 120 includes substantially cylindrical cone part 121 that has a reflective surface on its internal surface, and frame main body part 122 to which cone part 121 is attached. Cone part 121 is molded using a metal material, and can be produced by drawing or press-forming an aluminum alloy or the like, for example. Frame main body part 122 is molded using a hard resin material or a metal material. Frame main body part 122 is attached to base 110, whereby frame unit 120 is fixed.

Reflector 130 is an annular frame-shaped (funnel-shaped) reflecting component having an internal reflection function. Reflector 130 can be formed using a metal material, for example, aluminum or the like. Incidentally, reflector 130 may be formed using a hard white resin material instead of the metal material.

Light-transmitting panel 140 is a light-transmitting component having a light diffusion property and a light transmitting property. Light-transmitting panel 140 is a flat plate disposed between reflector 130 and frame unit 120, and is attached to reflector 130. Light-transmitting panel 140 can be formed to have a disc shape using a transparent resin material, for example, an acrylic resin or a polycarbonate resin.

It should be noted that light-transmitting panel 140 does not have to be provided. The structure without light-transmitting panel 140 can improve light flux of the illumination apparatus.

As illustrated in FIG. 10, lighting device 150 that feeds lighting power to light emitting device 1 and terminal base 160 that passes on AC power from a commercial power source to lighting device 150 are connected to illumination apparatus 100.

Lighting device 150 and terminal base 160 are fixed to attachment plate 170, which is provided separately from the apparatus main body. Attachment plate 170 is formed by bending a rectangular plate member formed of a metal material. Lighting device 150 is fixed to a lower surface of one end portion along a longitudinal direction of attachment plate 170, and terminal base 160 is fixed to a lower surface of the other end portion thereof. Attachment plate 170 is connected to top plate 180 that is fixed to an upper portion of base 110 of the apparatus main body.

As described above, according to the present embodiment, light emitting device 1 can be used in illumination apparatus 100 such as a downlight. The provision of light emitting device 1 according to the first embodiment to illumination apparatus 100 having the above-described structure can produce illumination light having high color rendering.

In particular, downlights and spotlights illuminate specific products and items in stores and the like, so that the downlights and spotlights are required to have high color rendering. Light emitting device 1 is used in the present embodiment to provide luminaire suitable for downlight, spotlight, and the like.

Although light emitting device 1 according to the first embodiment is used in the third embodiment, it is also possible to use light emitting device 2 according to the second embodiment instead.

Fourth Embodiment

Figure 11:
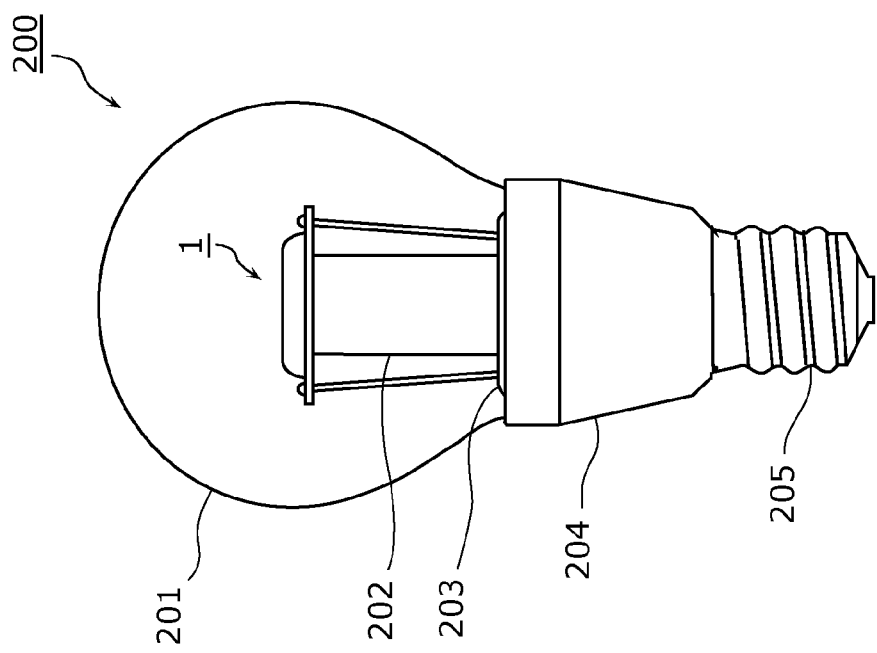
FIG. 11 is a schematic diagram of a structure of a bulb-shaped lamp according to a fourth embodiment.

Now, a structure of bulb-shaped lamp 200 according to a fourth embodiment will be described with reference to FIG. 11. FIG. 11 is a schematic diagram of a structure of the bulb-shaped lamp according to the fourth embodiment.

Bulb-shaped lamp 200 illustrated in FIG. 11 is an example of a light source for illumination, and includes light emitting device 1 according to the first embodiment described above.

Bulb-shaped lamp 200 includes: light-transmitting globe 201; light emitting device 1 serving as a light source; housing 204 that accommodates a drive circuit for supplying electric power to light emitting device 1; and lamp base 205 that receives the electric power from the outside.

AC power received by lamp base 205 is converted to DC power by the drive circuit and supplied to light emitting device 1. Incidentally, in the case where DC power is supplied to lamp base 205, the drive circuit does not have to have a conversion function from DC to AC.

Also, according to the present embodiment, light emitting device 1 is supported by support posts 202 and located in a central portion of globe 201. Support posts 202 are metal rods that extend from a vicinity of an opening of globe 201 toward an internal space of globe 201.

More specifically, support posts 202 are connected to support base 203 that is disposed in the vicinity of the opening of globe 201.

It should be noted that there is no particular need to provide support posts 202. In this case, light emitting device 1 may be supported directly by support base 203 instead of support posts 202. In other words, light emitting device 1 may be attached to a surface of support base 203 facing globe 201.

Globe 201 is a light-transmitting cover that transmits light of light emitting device 1 to an outside. Globe 201 according to the present embodiment is formed of a material transparent to light of light emitting device 1. As such globe 201, for example, a glass bulb made of silica glass that is transparent to visible light (a clear bulb) is adopted. In this case, light emitting device 1 accommodated in globe 201 can be visually identified from the outside of globe 201.

It should be noted that globe 201 does not have to be transparent to visible light but may have a light diffusion function. For example, the light diffusion function can be provided by applying a white pigment, a resin containing a light diffusion material such as silica or calcium carbonate, or the like to an entire internal or external surface of globe 201 so as to form a milky-white light diffusion film, or by providing roughness on the surface of globe 201. A material of globe 201 is not limited to glass but may be a resin such as a synthetic resin, for example, an acrylic (PMMA) resin or a polycarbonate (PC) resin.

Furthermore, a shape of globe 201 is not particularly limited but may be hemispherical, for example, when light emitting device 1 is directly supported by support base 203 (no support post 202 is provided).

As described above, according to the present embodiment, light emitting device 1 can be used in bulb-shaped lamp 200. The provision of light emitting device 1 according to the first embodiment to bulb-shaped lamp 200 having the above-described structure can produce illumination light having high color rendering.

Although light emitting device 1 according to the first embodiment is used in the present embodiment, it is also possible to use light emitting device 2 according to the second embodiment instead.

Incidentally, according to the present embodiment, light emitting device 1 can be used as a light source for illumination in a straight tube lamp or the like instead of the bulb-shaped lamp.

Also, such a bulb-shaped lamp can be used in an illumination apparatus including this bulb-shaped lamp. For example, the illumination apparatus can be constituted by the above-noted bulb-shaped lamp and a luminaire (lighting apparatus) to which the bulb-shaped lamp is attached. In this case, the luminaire includes, for example, an apparatus main body that is attached to a ceiling and has a socket in which the lamp base of the bulb-shaped lamp is mounted, and a cover that covers the bulb-shaped lamp.

Moreover, the straight tube lamp can also be used in an illumination apparatus including this straight tube lamp. For example, the illumination apparatus can be constituted by the straight tube lamp and a luminaire (lighting apparatus) including a pair of sockets to which the straight tube lamp is attached.

Other Variations, Etc.

Although the light emitting device, the light source for illumination, and the illumination apparatus according to the present disclosure have been described above based on the embodiments and their variations, the present disclosure is not limited to the embodiments and variations described above.

For example, in the light emitting device according to the above-described embodiments and variations, white light has been generated by combining the blue LED chips and the yellow phosphor. However, a structure for generating white light is not limited to the above. More specifically, a phosphor-containing resin containing a red phosphor and a green phosphor may be used and combined with the blue LED chips, thereby generating the white light. Alternatively, an ultraviolet LED chip that emits ultraviolet light, which has a wavelength shorter than the wavelength of the blue LED chip, and phosphors of respective colors that are excited mainly by ultraviolet light and emit light of three primary colors (red, green and blue) may be combined together, thereby generating the white light.

Furthermore, although the phosphor has been used as the wavelength conversion material in the embodiments and variations described above, there is no particular limitation to this. For example, the wavelength conversion material may be a material containing a substance that absorbs light at a certain wavelength and emits light at a wavelength different from the absorbed light, such as a semiconductor, a metal complex, an organic dye, or a pigment.

Moreover, although the LED chips have been used in the embodiments and variations described above, each LED chip may be replaced with a semiconductor light emitting element such as semiconductor laser, an electro luminescence (EL) element such as an organic EL element or an inorganic EL element, or other solid-state light emitting elements.

Additionally, although in the embodiments and their variations described above, the light emitting device is used in the downlight or the spotlight, the application of the light emitting device is not limited to them. For example, the light emitting device according to the embodiments and variations described above may also be used as a light source of other luminaires (illumination apparatuses) such as a base light. In this case, the base light may also have a structure in which the light emitting device is directly attached to the base. Moreover, the light emitting device according to the embodiments and variations described above can also be used as a light source for uses other than illumination such as a light source for a backlight in a liquid crystal display apparatus or the like, a light source for a lamp in a copier or the like, or a light source for a guide light, a billboard or the like.

Other than the above, a mode obtained by making various modifications conceivable by a person skilled in the art to each of the embodiments and variations or a mode realized by freely combining structural components and functions in each of the embodiments and variations without departing from the purport of the present disclosure also falls within the scope of the present disclosure.

What is claimed is:

1. A light emitting device that emits white light, the light emitting device comprising:
a first light emitting element and a second light emitting element which have different emission peak wavelengths, each emission peak wavelength being within a range of 440 nm to 495 nm; and
a wavelength conversion material which converts a wavelength of light emitted by at least one of the first light emitting element and the second light emitting element,
wherein the white light has an emission spectrum with peaks at a first peak wavelength and at a second peak wavelength, the first peak wavelength corresponding to the emission peak wavelength of the first light emitting element, and the second peak wavelength corresponding to the emission peak wavelength of the second light emitting element,
wherein, a light intensity at a bottom of a valley between the first peak wavelength and the second peak wavelength is between 50% and 99% of the intensity of the lower one of the first peak wavelength and the second peak wavelength, and
wherein a special color rendering index R12 of the white light as a value of 90 or greater.

2. The light emitting device according to claim 1,
wherein the light intensity at the bottom of the valley is at least equal to 80% of the light intensity of the lower one of the first peak wavelength and the second peak wavelength.

3. The light emitting device according to claim 1,
wherein the second peak wavelength is longer than the first peak wavelength, and
a light intensity at the second peak wavelength is higher than a light intensity at the first peak wavelength.

4. The light emitting device according to claim 3,
the light intensity at the second peak wavelength is between 100% and 200% of the light intensity at the first peak wavelength.

5. The light emitting device according to claim 3, further comprising
a first sealing member including the wavelength conversion material,
wherein the first sealing member seals at least the first light emitting element.

6. The light emitting device according to claim 5, further comprising
a second sealing member sealing the second light emitting element.

7. The light emitting device according to claim 6,
wherein the first light emitting element is a first LED chip in a first container,
the second light emitting element is a second LED chip in a second container,
the first sealing member is in the first container, and
the second sealing member is in the second container.

8. The light emitting device according to claim 5,
wherein each of the first light emitting element and the second light emitting element is a light emitting diode (LED) chip mounted on a substrate.

9. The light emitting device according to claim 1,
wherein the first light emitting element and the second light emitting element are connected to each other in series.

10. The light emitting device according to claim 1,
wherein the wavelength conversion material is a phosphor.

11. The light emitting device according to claim 10,
wherein the first light emitting element emits blue light,
the second light emitting element emits blue-green light, and
the phosphor is a yellow phosphor that emits yellow fluorescent.

12. The light emitting device according to claim 1, further comprising
a third light emitting element having an emission peak wavelength within a range of 620 nm to 750 nm.

13. The light emitting device according to claim 12,
wherein the third light emitting element is connected in series to at least one of the first light emitting element and the second light emitting element.

14. A light source for illumination, comprising
the light emitting device according to claim 1.

15. An illumination apparatus comprising
the light emitting device according to claim 1.

* * * * *